(12) United States Patent
Bindig et al.

(10) Patent No.: US 6,208,026 B1
(45) Date of Patent: Mar. 27, 2001

(54) EXTERNAL ELECTRODE FOR A MONOLITHIC MULTI-LAYER ACTUATOR

(75) Inventors: Reiner Bindig, Bindlach; Andreas Gunther, Speikern; Gunther Helke, Laug; Jurgen Schmieder, Lauf, all of (DE)

(73) Assignee: CeramTec AG Innovative Ceramic Engineering, Plochingen (DE)

( * ) Notice: Subject to any disclaimer, the term of this patent is extended or adjusted under 35 U.S.C. 154(b) by 0 days.

(21) Appl. No.: 08/977,892

(22) Filed: Nov. 25, 1997

(30) Foreign Application Priority Data

Nov. 25, 1996 (DE) ............................. 196 48 545

(51) Int. Cl.⁷ ..................................... H01L 23/34
(52) U.S. Cl. .......................... 257/718; 257/719
(58) Field of Search ..................... 257/719, 718, 257/739, 786, 780, 773, 310

(56) References Cited

U.S. PATENT DOCUMENTS

| | | | |
|---|---|---|---|
| 4,012,588 | 3/1977 | Davis et al. | 178/18 |
| 4,917,484 | 4/1990 | Heinz | 350/487 |
| 4,967,166 * | 10/1990 | Marcellus | 331/116 R |
| 5,245,734 * | 9/1993 | Issartel | 29/25.35 |
| 5,402,004 * | 3/1995 | Ozmat | 257/717 |
| 5,438,477 * | 8/1995 | Pasch | 361/689 |
| 5,528,456 * | 6/1996 | Takahashi | 361/704 |
| 5,557,501 * | 9/1996 | DiStefano et al. | 361/704 |
| 5,597,494 * | 1/1997 | Kohno | 216/6 |

FOREIGN PATENT DOCUMENTS

0569235A1   11/1993   (EP) .

* cited by examiner

*Primary Examiner*—Olik Chaudhuri
*Assistant Examiner*—Phat X. Cao
(74) *Attorney, Agent, or Firm*—Antonelli, Terry, Stout & Kraus, LLP

(57) ABSTRACT

A monolithic multi-layer actuator includes a sintered stack of thin films of piezoceramic material with metallic internal electrodes which lead out of the stack (2) in alternate directions and are connected electrically in parallel by way of external electrodes, with the external electrodes on the contact sides of the stack consisting of an applied basic metallisation and being connected to electrical connection elements preferably by way of soldering. In order to avoid failures of the actuator during dynamic loads it is suggested that an electroconductive electrode which is structured to be three-dimensional in structure be arranged between the basic metal lining and the connection elements, which electrode is connected to the basic metallisation by way of partial contact points and is constructed to be expandable between the contact points.

13 Claims, 3 Drawing Sheets

FIG. 6   FIG. 7   FIG. 8

EXTERNAL ELECTRODE FOR A MONOLITHIC MULTI-LAYER ACTUATOR

BACKGROUND OF THE INVENTION

The invention relates to a monolithic multi-layer actuator.

With piezoceramic materials use is made of the effect that they are charged when subject to a mechanical load or pulling force and, on the other hand, in the event of electrical charging, they expand or contract. In order to reinforce this effect, monolithic multi-layer actuators are used which consist of a sintered stack of thin films of piezoceramic material (for example lead zirconate titanate) with inserted metal internal electrodes. The internal electrodes lead out of the stack in alternate directions and are connected electrically in parallel by way of external electrodes. For this purpose a basic metallisation is applied to the contact sides of the stack, which metal is connected to the individual internal electrodes. The basic metallisation is reinforced by means of areal or partial covering of the basic metallisation with solder. This reinforcement produces, on the one hand, the necessary material cross section in order to carry the high currents which occur during operation of the actuator (about 20–80 amperes). On the other hand, the soldering-on of electrical supply leads is made possible.

If an electric voltage is applied to the external electrodes, the piezofilms expand in the field direction. The nominal expansion of all the piezoceramic material is achieved already at low electrical voltages by means of the mechanical series connection of the individual piezofilms.

The indicated monolithic multi-layer actuators are described in detail in DE 40 36 287 C2. Use in a flow throughput control valve is also indicated here.

Piezoceramic materials are naturally brittle and have only a low tensile strength (about $80.10^6$ Pa). This is further reduced with multi-layer actuators by way of the laminar arrangement of the internal electrodes and the anisotropy of the strength which occurs during polarization. The maximum permitted tensile stress is often exceeded already during polarization with the result that cracking inevitably occurs.

However, there is no indication that this type of cracking leads to failure of the actuators under normal operating conditions.

The growth of cracking within the ceramic materials can additionally be influenced considerably by grain size, grain boundary composition and porosity. Under suitably set conditions cracks do not run in a transcrystalline manner and are rapidly stopped by energy sinks at grain boundaries and pores. Already after about 1000 loading cycles the crack growth has largely stopped and even after long operating times ($10^9$ cycles) only increases slightly.

However, with high dynamic loads of the multi-layer actuators, these cracks can become critical if the cracks in the ceramic material cut through the basic metallisation and the applied layer of solder. In the most favourable case only individual piezofilms are then separated. However, voltage flashovers at the crack edge occur substantially more frequently, which voltage flashovers lead to a destruction of the multi-layer actuator because the entire operating current flowing at this point is disconnected.

SUMMARY OF THE INVENTION

The object of the invention therefore is to improve a monolithic multi-layer actuator in such a way that even with high dynamic loads no destruction of the multi-layer actuator occurs.

In accordance with the invention the object is achieved by arranging a three-dimensionally structured electroconductive electrode between the basic metallisation and the connection elements, which electrode is connected to the basic metallisation by way of partial contact points and is constructed to be expandable between the contact points. The operating current of the actuator is divided into secondary currents by means of this arrangement. The secondary currents flow from the contact points by way of the basic metallisation to the metallic internal electrodes and typically amount to 0.5 amperes. A reinforcement of the basic metal lining is not necessary for these currents.

By means of this construction in accordance with the invention, allowance is made that during the dynamic operation of the actuator the base metallisation can receive cracks. However, these cracks cannot be propagated in the electrode which is in a three-dimensional structured because the electrode is only connected to the basic metallisation by way of partial contact points and is constructed to be expandable between the contact points. In this way the electrical contact is always maintained because the operating current flowing in the three-dimensional electrode is on no occasion interrupted. The cracks occurring in the basic metallisation only lead to a diverting of the secondary currents by way of the three-dimensional electrode.

A dynamic load is understood to mean the application of an alternating voltage. The level of the dynamic load depends on the edge steepness of the individual pulses and the frequency. With high dynamic loads the edge steepness lies typically at 10 to 500 $\mu$s, the frequency typically between 10 and 1000 Hz. Tests, even long term tests, have shown that with these dynamic loads no failures of the multi-layer actuators in accordance with the invention were to be recorded.

In a preferred embodiment the electrode between the contact points lifts from the basic metallisation and is advantageously a structured metal foil. These films with a thickness of about 50 $\mu$m are expandable and are excellently suitable for the electrode in accordance with the invention.

The lifting from the basic metallisation can be easily achieved if the electrode has a wave-like cross section. A herringbone pattern—seen from above—is also eminently suitable.

So that the electrode projects somewhat from the basic metallisation. The electrode is advantageously provided with knobs at the contact points. It is likewise advantageous if the electrode is provided with openings for washing processes of the base metallisation. Used fluxing material can be efficiently removed by means of the washing processes.

In a preferred embodiment the electrode is constructed as a cooling body. This reduces the thermal loading of the actuator.

The electrode can also advantageously be a knitted wire, wire mesh or open-pored metal sponge.

Advantageously the electrode is connected to the basic metallisation at the contact points by means of soldering, adhesion with conductive adhesives or welding, for example laser-welding.

Bronze or brass have proven to be particularly advantageous as the material for the electrodes.

BRIEF DESCRIPTION OF THE DRAWINGS

Further features of the invention are evident from the Figures which are described in the following.

FIG. 6 shows a plan view of an electrode which is wave-like in cross section, similar to FIG. 3.

FIG. 7 shows a plan view of an electrode with a herringbone pattern.

FIG. 8 shows a section along the line A—A in a wave trough in FIG. 6.

DETAILED DESCRIPTION OF THE PREFERRED EMBODIMENTS

Figure 1:
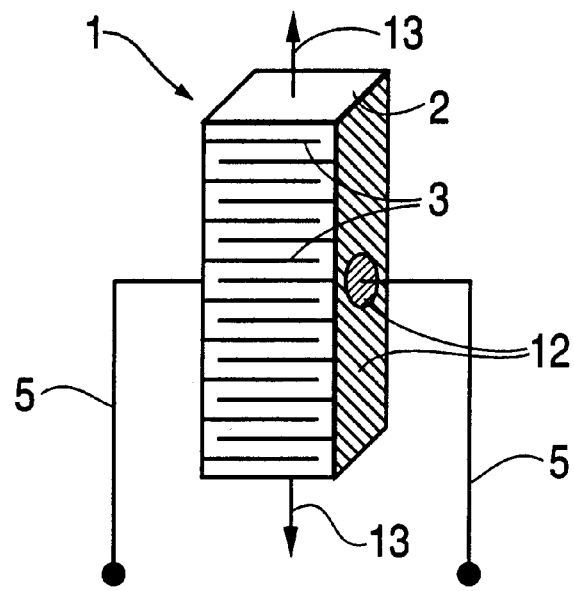
FIG. 1 shows diagrammatically a multi-layer actuator according to the prior art.

FIG. 1 shows diagrammatically a multi-layer actuator in accordance with the prior art. The stack 2 comprises sintered films of piezoceramic material with inserted metal internal electrodes 3. The electrodes 3 lead out of the stack in alternate directions and are connected electrically in parallel by way of external electrodes.

Figure 2:
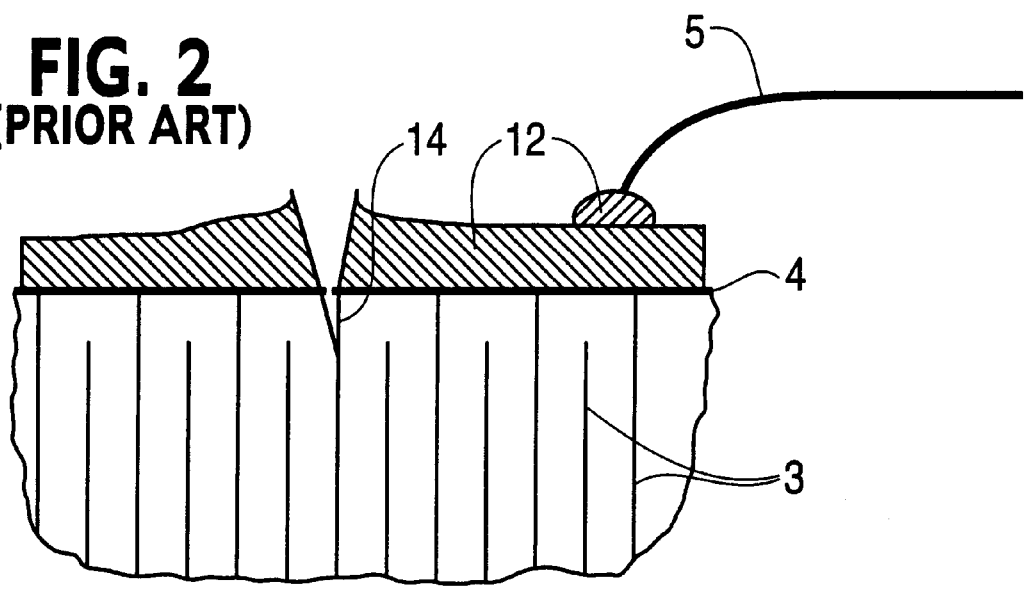
FIG. 2 shows a cross section through a multi-layer actuator according to the prior art, which has become unusable because of a crack.

FIG. 2 shows a portion of the multi-layer actuator in section. For the parallel connection a base metallisation 4 is applied to the contact sides of the stack 2. Connection elements 5 are fastened to this basic metallisation 4 by way of solderings or solders 12. Upon the application of a voltage to the connection elements 5, the stack 2 expands in the direction of the arrows 13. If an alternating voltage of corresponding output is applied, the stack performs an expansion and contraction movement in the clock pulse of the alternating frequency.

Slight cracks 14 occur in the ceramic material as a result of this dynamic loading, the cracks in the most unfavourable case cutting through the basic metallisation 4 and the applied layer of solder 12.

Figure 3:
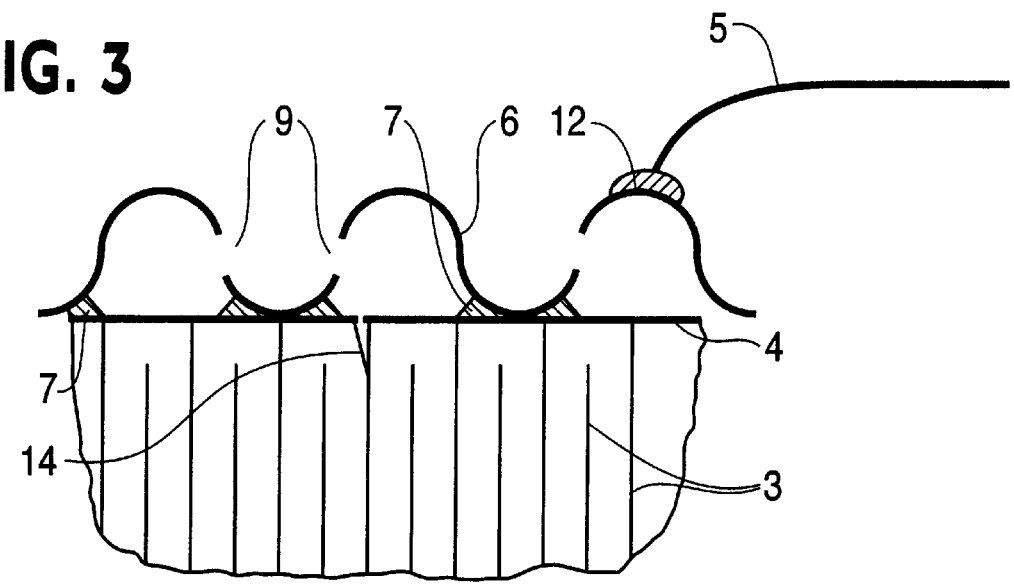
FIG. 3 shows a section through an actuator in accordance with the invention with a structured wavelike electrode.

FIG. 3 shows a section similar to FIG. 2 through a multi-layer actuator in accordance with the invention with a wave-like three-dimensional electrode 6 connected to the base metallisation 4. FIG. 6 shows a plan view of this electrode 6 which comprises wave troughs and wave crests arranged in parallel. This electrode 6 is connected in electroconductive manner at contact points 7 to the basic metallisation 4, for example by means of laser welding. For cleaning the basic metallisation 4, openings 9 are arranged in the electrode 6. A few of these openings 9 are shown by way of example in FIG. 3. The electrode 6 preferably comprises a metal foil of, for example, bronze or brass. In this respect it is important that the region between the contact points 7 is expandable so that no breaks in the electrode 6 can occur due to cracks 14 in the ceramic material. As a result of the large surface of the electrode 6, the latter can be used advantageously as a cooling body for the multi-layer actuator. The connection elements 5 can be connected to the electrode 6 at any point.

Figure 4:
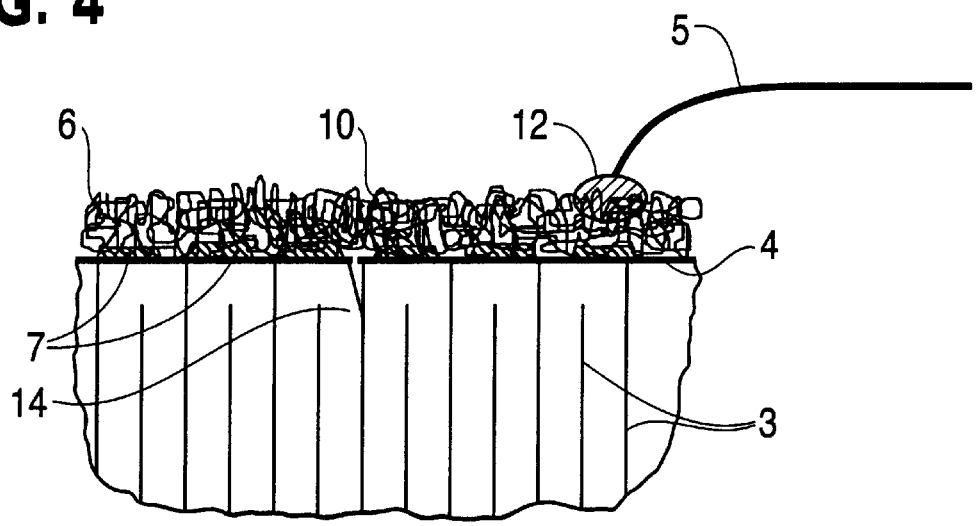
FIG. 4 shows an actuator with a knitted wire as electrode.

FIG. 4 shows an actuator with knitted wire 10 as electrode 6. The individual contact points or solderings of the knitted wire 10 with the base metallisation are again characterized by the reference number 7. It can be easily recognized that a crack 14 does not lead to any cutting-through of the electrode 6 because the crack 14 is electrically short-circuited by the electrode 6.

Figure 5:
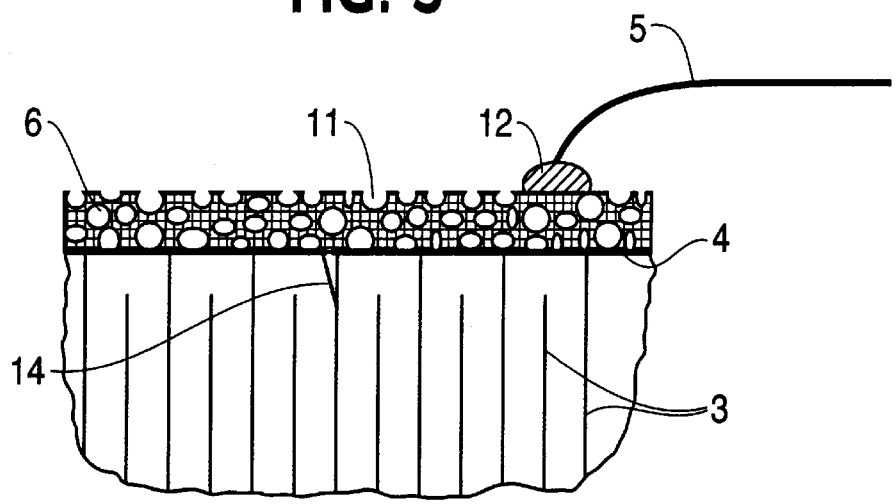
FIG. 5 shows an actuator with metal sponge as electrode.
Figure 5:
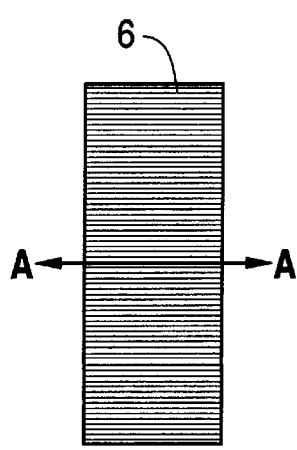
Figure 5:
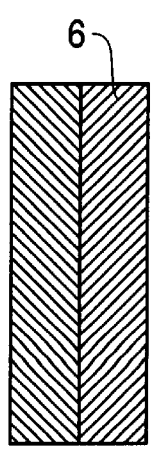
Figure 5:
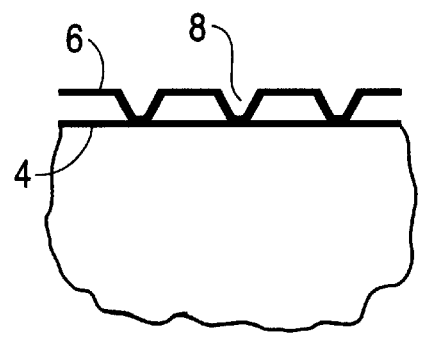

FIG. 5 shows an actuator with metal sponge 11 as electrode 6. The metal sponge 11 is preferably constructed to be open-pored. The contact points and the individual solder points are not drawn here for the sake of simplicity. Otherwise the same reference symbols denote the same objects.

As already described, FIG. 6 shows in plan view a wave-like electrode 6. The wave trains extend here in a straight line and are arranged in parallel.

FIG. 7 shows a plan view of an electrode 6 with a herringbone pattern. Here also a wave crest is arranged adjacent to each wave trough.

FIG. 8 shows a section along the line A—A in a wave trough in FIG. 6. The electrode 6 here contacts the basic metallisation with knobs 8.

Diverse other electrode forms are conceivable for an expert, with it always having to be ensured that the electrode only contacts the basic metallisation by way of a number of contact points, i.e. not all over, and it being possible for the intermediate region between two contact points to can carry out a certain expansion with respect to the expansion and contraction of the stack, so that the electrode 6 in this region is not cut through in the event of a crack occurring in the ceramic material.

What is claimed is:

1. Monolithic multi-layer actuator comprising a sintered stack of thin films of piezoceramic material with inserted metallic internal electrodes which lead out of the stack in alternative directions and are connected electrically in parallel by way of external electrodes, with the external electrodes on contact sides of the stack comprising an applied basic metallisation, being connected to electrical connection elements, characterized in that an electroconductive electrode structured in a three-dimensional manner is arranged between the basic metallisation and the connection elements and is connected to the basic metallisation by fixed connections to partial contact points and is constructed so that it can expand between the contact points.

2. Multi-layer actuator according to claim 1, characterized in that the electrode rises from the basic metallisation between the contact points.

3. Multi-layer actuator according to claim 1, characterized in that the electrode is a structured metal foil.

4. Multi-layer actuator according to claim 1, characterized in that the electrode has a wave-like cross section.

5. Multi-layer actuator according to claim 1, characterized in that the electrode is provided with knobs at the contact points with the basic metallisation.

6. Multi-layer actuator according to claim 1, characterized in that the electrode is provided with openings for washing processes to which the basic metallisation is subject.

7. Multi-layer actuator according to claim 1, characterized in that the electrode is constructed as a cooling body.

8. Multi-layer actuator according to claim 1, characterized in that the electrode is a knitted wire/wire mesh or open-pored metal sponge.

9. Multi-layer actuator according to claim 1, characterized in that the electrode is fixedly connected to the basic metallisation at the contact points by means of soldering, adhesion with conductive adhesives or welding.

10. Multi-layer actuator according to claim 1, characterized in that the electrode is made from bronze or brass.

11. Multi-layer actuator according to claim 1, wherein the basic metallisation carries a current of 20–80 amperes during operation of the actuator.

12. Multi-layer actuator according to claim 11, wherein the electrical connection elements are connected to an alternating voltage source having a frequency between 10 and 1000 Hz and a clock pulse having an edge steepness of 10 to 500 $\mu$s.

13. Multi-layer actuator according to claim 9, wherein the electrode is fixedly connected to the basic metallisation by laser welding.

* * * * *